United States Patent [19]

Benoit et al.

[11] Patent Number: 4,910,476
[45] Date of Patent: Mar. 20, 1990

[54] HIGH-FREQUENCY AMPLIFIER WITH AUTOMATIC NEUTRODYNING CIRCUIT

[75] Inventors: Michel Benoit, Thonon les Bains; Guy Peillex-Delphe, Evian les Bains, both of France

[73] Assignee: Thomson-CSF, Paris, France

[21] Appl. No.: 257,835

[22] Filed: Oct. 14, 1988

[30] Foreign Application Priority Data

Oct. 16, 1987 [FR] France ................... 87 14293

[51] Int. Cl.⁴ ............................................. H03F 1/16
[52] U.S. Cl. ............................................. 330/76
[58] Field of Search ..................... 330/76, 78, 80, 292

[56] References Cited

U.S. PATENT DOCUMENTS 1,646,027 10/1927 Lange .
3,546,613 12/1970 Breuer ................................. 330/292

FOREIGN PATENT DOCUMENTS 892018 3/1943 France .
87211 4/1956 Norway ................................. 330/76

OTHER PUBLICATIONS

Japanese Journal of Applied Physics, vol. 20, suppl. 20-1, 1981, pp. 87-91, Tokyo, JP; M. Aiga et al.

Primary Examiner—James B. Mullins
Attorney, Agent, or Firm—Oblon, Spivak, McClelland, Maier & Neustadt

[57] ABSTRACT

High frequency amplifiers require neutrodyning to prevent the risks of self-oscillation generated by the existence of stray capacitances among the electrodes of the active component used in the amplifier. Grid tube amplifiers (such as triodes, tetrodes, pentodes etc.) are more particularly concerned. Instead of simply providing a variable inductive element, in parallel, on the stray capacitance between the input electrode and the output electrode, there is provided a star connection of three reactances between the input electrode, the output electrode and the reference electrode. Only the first reactance is variable. The others are fixed and are in a constant ratio independent of the frequency. Preferably, the variable reactance element is an inductive element, and the other two are capacitive elements. Thus, by means of this single, variable reactance element, it is possible to make a setting, at the same time, of the input or output frequency tuning of the amplifier and of the neutrodyning.

12 Claims, 5 Drawing Sheets

HIGH-FREQUENCY AMPLIFIER WITH AUTOMATIC NEUTRODYNING CIRCUIT

BACKGROUND OF THE INVENTION

1. Field of the Invention

The present invention concerns electronic amplifiers working at high frequency. The term "high frequency" is used herein to mean frequencies which are, in principle, higher than one megahertz but, more generally, frequencies which are sufficiently high, in view of the stray reactances of the active components used in the amplifier, to entail the risk of self-oscillation in the amplifier.

A risk of self-oscillation appears as soon as the stray reactances cause a re-injection, towards the input of the amplifer, of an excessively high fraction of the output signal, and as soon as this fraction is added to the original input signal.

The invention is particularly applicable to amplifiers for which the main active component is a vacuum electronic tube (a grid tube such as a triode, a tetrode, a pentode, etc) and shall be described in detail with reference to this type of amplifier. But it can be applied more generally to other types of amplifiers, including transistor amplifiers.

2. Description of the Prior Art

The risks of self-oscillation in a triode amplifier, in an assembly where the cathode of the triode is grounded, are dee essentially to the existence of a stray capacitance between the control gate and the anode of the triode. Similarly, risks of undesirable self-oscillation appear in a transistor amplifier owing to stray junction capacitances between the base of the transistor, on the one hand, and the collector and emitter on the other hand. The same is true for field-effect transistors because of capacitances between the control gate and the source and drain.

The following description shall refer solely to assemblies with grid tubes without said description being in any way restrictive, and the invention is applicable provided that the amplifier comprises an active component having at least three electrodes, one of which receives a high frequency input signal to be amplified, another gives an amplified high frequency signal, and a third is used notably to define a reference potential for the other two electrodes, at least as regards high frequency.

Figure 1:
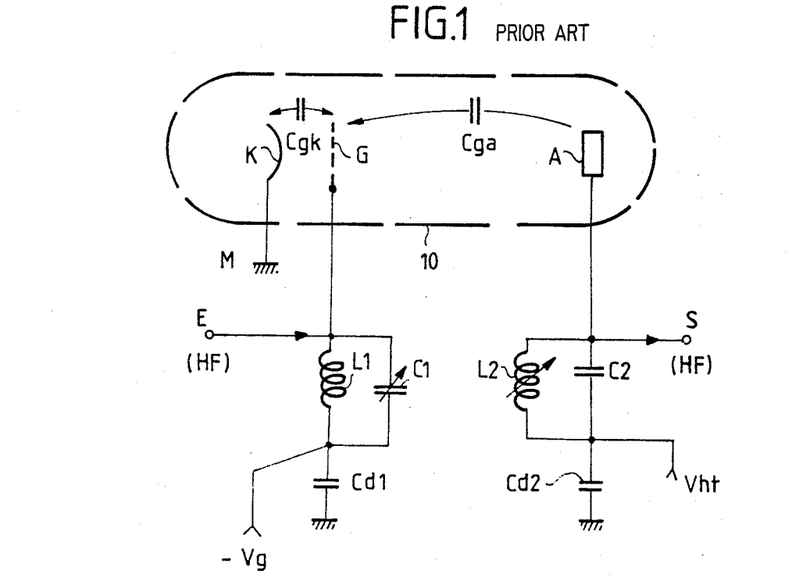
FIG. 1 and FIG. 2, already described, explain the problem of neutrodyning and the practical method commonly used in the prior art.

FIG. 1 shows, by way of an example, a triode amplifer in which no precaution has been taken to neutralize risks of self-oscillation.

The amplifier has a triode 10 with a cathode K connected to a ground M, not only for AC currents but also for DC current. A gate G receives the high frequency signal to be amplified, and an anode A gives an amplified high frequency signal. The gate G is connected to an input E coupled to a previous stage by connecting and tuning circuits (not shown) depending on the application envisaged. Similarly, the anode A is connected to an output S connected to a following stage by connecting or tuning circuits (not shown) depending on the application considered. By construction, given the proximity of the different electrodes to one another, there is a stray capacitance Cgk between the gate and the cathode and a stray capacitance Cga between the gate and the anode.

The signal input is done by means of an input circuit which can be tuned to a range of frequencies to be amplified. In the example shown, the tuned input circuit comprises an inductive element L1 in parallel with a capacitive element C1. The value of the inductive element and that of the capacitive element can be adjusted to set the amplifer as a function of the frequency to be amplified. This circuit L1, C1, is connected between the gate and the ground by means of an uncoupling capacitive element Cd1, the value of which is high enough for its impedance to be negligible as compared with that of the other elements of this circuit at the frequencies considered. Thus, the circuit L1, C1 may be considered to have a terminal which is virtually grounded for the high frequency currents. A negative bias voltage $-Vg$ is brought to the gate G through the inductive element L1.

Another tuning circuit, comprising an inductive element L2 in parallel with the capacitive element C2, is connected, firstly, to the anode A and, secondly, through an uncoupling capacitive element Cd2, having the same role as the capacitive element Cd1, to the ground M. The inductive element L2 or the capacitive element C2 can be adjusted to achieve the frequency tuning at the output of the amplifier. A high supply voltage Vht is applied to the anode through the inductive element L2.

The circuit thus described constitutes only one embodiment. Other frequently used assemblies comprise a signal input at the cathode and not at the gate, the gate being grounded for the high frequency current by an uncoupling capacitive element similar to the capacitive element Cd1. Certain assemblies even use a signal input at the gate and an output at the cathode, the anode being grounded. Similar circuits could be described wherein the active component is a tetrode o a pentode. All these circuits are subject to risks of self-oscillation due to stray capacitances between the output and the input. The method most usually employed to neutralize this risk (called the neutrodyning operation) consists in placing inductive circuit elements in parallel on the troublesome stray capacitance, (the capacitance Cga in FIG. 1 because it brings a fraction of the output signal present at the anode directly to the gate). These inductive circuit elements are elements such that the association of the capacitive element and inductive element in parallel forms a anti-resonant circuit at the working frequency, namely a circuit with very high impedance (infinite impedance in theory), where the ohmic losses are overlooked. The signal fraction re-injected from the output (anode) towards the input (gate) will be all the more negligible as this impedance between the anode and the gate will be high.

Figure 2:
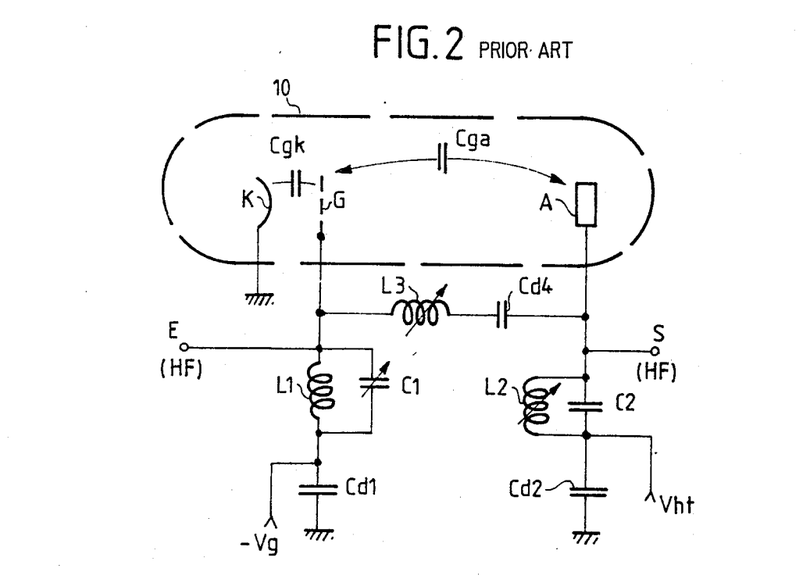

This method leads to a diagram such as the one shown in FIG. 2. In this figure, it is seen that a variable inductive element L3 has been added, series-mounted with a capacitive element Tt4, this set of elements being in parallel between the gate G and the anode A. The capacitive element Cd4 is a linking capacitive element that prevents the transmission of direct voltage from the anode to the gate. Its impedance is negligible, at the frequencies considered, when compared with that of the inductive element L3. The inductive element L3, the value of which is such that $L3 \cdot Cga \cdot w^2 = 1$, forms a high impedance anti-resonant circuit with the capacitive element Cga, w being the pulsation corresponding to the working frequency. This inductive element thus achieves the desired neutrodyning effect. The inductive element N3 is made in the form of a variable inductive element to enable the neutrodyning to be set for commissioning the amplifier to operate at a user-specified working frequency or to enable the neutrodyning operation to be started again at other frequencies if the user wishes to make his amplifer work at different frequencies.

The user of the amplifer has to make several settings when commissioning the equipment or when changing the working frequency, so as to achieve:
  efficient neutrodyning,
  frequency tuning at the input tuning circuit L1, C1,
  frequency tuning at the output tuning circuit L2, C2, These numerous settings entail several drawbacks. The first drawback, naturally, is the cost of the adjustable elements (variable inductive elements, variable capacitive elements, etc.) as compared with those of the fixed elements. The second and biggest drawback is the fact that each setting operation reacts on the other ones: a modification in the value of the inductive element L3 entails a modification in the tuning of the input circuit and vice-versa.

It is well known that the frequency setting of a neutrodyned amplifer is a delicate operation performed by successive approximations, and that only specialists can perform this operation swiftly. For example, when installing a radio-electrical transmission amplifier, it is the installer who performs this operation. If the setting goes wrong later any resetting by the user is often done very roughly and results in lower performance characteristics, either because of repeated hitches requiring action by the installer, or even because the components, and especially the grid tube, are destroyed.

An aim of the invention is to propose a high frequency amplifier assembly which does not have these drawbacks.

SUMMARY OF THE INVENTION

To achieve this aim, there is proposed a circuit structure with three reactance elements connected in a star connection among the three electrodes of the tube, or more generally, of the active component, one of the reactance elements connected to the first electrode, being adjustable and the other two reactance elements, connected to the other two electrodes, being fixed and essentially having, between them, a constant ratio among them which is independent of the frequency, in a range of frequencies, at which it is sought to make the amplifier work.

It will be shown that, by an appropriate choice of the ratio between the two fixed impedances, it is possible to attain a strictly simultaneous setting of the input tuning (or output tuning as the case may be) and of the neutrodyning in the entire range of frequencies of the amplifier. This setting is done by varying the variable impedance.

A preferred theoretical value for this ratio between two impedances will be defined below. However, in practice, the exact optimal theoretical value will perhaps not be chosen (all the more so, as it is difficult to measure this value) but conditions will be achieved such that the setting of the neutrodyning operation and of the input or output tuning can be done simultaneously with a single setting element.

In principle, it will be seen to it that the ratio between the value of the reactance element connected to a second electrode and the value of the reactance element connected to a third electrode is essentially equal to the ratio between, on the one hand, the capacitance existing between the first electrode and the third electrode and, on the other hand, the capacitance existing between the first electrode and the second electrode.

In certain embodiments, the variable reactance element will be a variable inductive element enabling the frequency setting by the user, and the other two reactance elements will be essentially fixed capacitive elements.

In other embodiments, the variable reactance element will be a variable inductive element enabling the frequency setting by the user, and the other two reactances will be essentially fixed inductive elements.

In other embodiments again, the variable reactance element will be a variable capacitive element enabling the frequency setting by the user, and the other two reactances will be essentially fixed inductive element.

Should the setting element act both as a neutradyning element and as an element to set the input tuning, it will be assumed that the first electrode is the electrode receiving the input signal to be amplified, for example the gate of a triode in a grounded cathode assembly, the second electrode being the electrode giving an amplified output signal (for example the anode) and the third electrode being an electrode which may be carried to a reference potential for the signal to be amplified (for example, the cathode).

The preferred value of the ratio between the fixed reactance elements connected to the second and third electrode is then a value Cgm/Cga, wherein:

Cgm is the capacitance existing between the first electrode, receiving the input signal to be amplified, and the third electrode which forms the potential reference for the signal to be amplified. This capacitance is due as much to the stray capacitances as to the capacitances which may have been deliberately added;

Cga is the capacitance present between the second electrode, which gives an amplified signal, and the first electrode; it too results as much from stray capacitances as from deliberately added capacitances.

Should the setting element have to serve both for the adjustment of the neutrodyning and for the setting of the output tuning, it will be assumed that the first electrode is the electrode giving the output signal; the preferred value of the ratio is C2/Cga where C2 is the capacitance between the output electrode (first electrode) and the third electrode, while Cga is the capacitance between the output electrode (first electrode) and the input electrode (second electrode).

In all cases, especially at high frequencies, the impedances, including the adjustable impedance, may be achieved without distinction by elements with localized constants such as capacitive elements or coils or by elements with distributed constant,, namely coaxial or bifilar lines, open or short-circuited, which may be equivalent, as the case may be and depending on their length, to positive or negative reactances, namely, to inductances or capacitance. The adjustable impedance is then formed by a line of this type with a short circuit (or an open circuit) of variable position, making it possible to vary the effective length of the line.

Finally, as already stated, the invention applies to amplifiers for which the main active component may consist of other elements than a triode.

BRIEF DESCRIPTION OF THE DRAWINGS

Other features and advantages of the invention will appear from the following detailed description, made with reference to the appended drawings, of which.

DESCRIPTION OF PREFERRED EMBODIMENTS

Figure 3:
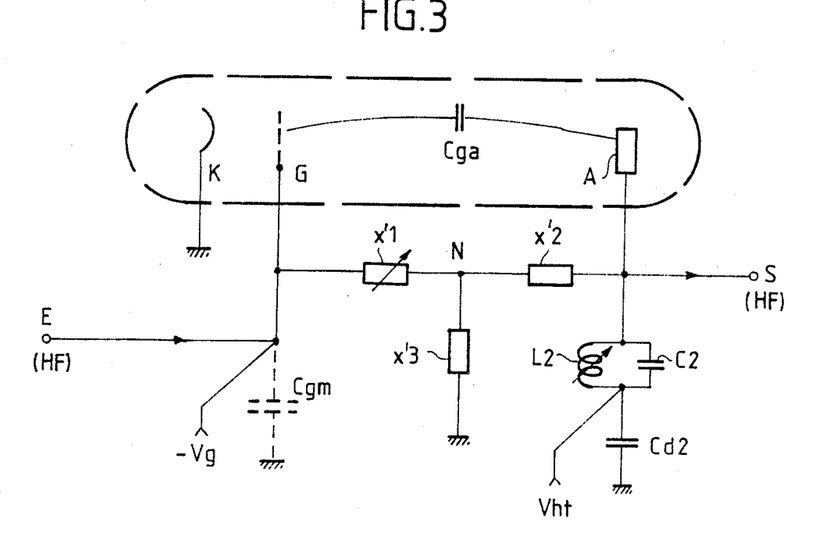
FIG. 3 shows a general drawing of the neutrodyned amplifier according to the invention, in a case where it is sought to perform the neutrodyning and the frequency tuning at the amplifier input in a single operation.

A general drawing of a neutrodyned amplifer according to the invention is shown in FIG. 3 in the case of a triode assembly with a grounded cathode. It is therefore easy to explain the essential structural differences with respect to the drawing of FIG. 2, which is also a triode drawing with the cathode grounded.

The inductive element L1 of FIGS. 1 and 2, which was used to tune the frequency at the amplifier input, is eliminated. The inductive element L3, series-mounted with the uncoupling capacitive element Cd4 of FIG. 2, is also eliminated and replaced by a star connection of three reactance elements, $x'1$, $x'2$, $x'3$, connected between the three electrodes of the tube, namely between the gate G, the cathode K and the anode A.

The reactance element $x'1$, connected between the electrode receiving the input signal, namely, the gate G and the common node N of the star connection, is a variable reactance element enabling a user to set the operating frequency of the amplifier.

The reactance elements $x'2$ and $x'3$ are fixed reactance elements (or, at least, reactance elements for which the setting, made outside the installation, has not been altered when changing the working frequency). The values of the reactance elements, $x'2$ and $x'3$, are in a constant ratio (independent of the frequency) such that when it is desired to make $x'1$ vary in order to set the operation of the amplifier to a chosen frequency, the input tuning and the neutrodyning are done simultaneously, and this is done in a way which depends little on whether or not the output tuning has been done beforehand. The preferred value to be given to this ratio shall be explained further below.

The reactance element $x'2$ is connected between the common node N and the second electrode of the tube, namely the electrode (the anode A herein) which gives the output signal.

The reactance element $x'3$ is connected between the common node N o the star connection and the third electrode of the tube (herein the cathode K which is connected to the ground).

Cgm designates the capacitance present between the first electrode (gate G) and the third electrode (cathode K at ground M). This value Cgm essentially comprises the value of the stray gate-cathode capacitance Cgk which was mentioned with reference to FIG. 1 and 2, but also, as the case may be, the value of additional capacitive elements added n parallel between gate and ground such as, for example, the capacitive element C1 of FIGS. 1 and 2. It is found that, most often, the stray capacitance Cgk is high enough for it to be unnecessary to add any additional capacitance, such as that of the capacitive element C1, to tune the amplifier at the desired frequencies.

Cga designates the stray capacitance between the first electrode (gate G) and the second electrode (anode A).

The preferred theoretical ratio between the reactances $x'2$ and $x'3$ is equal to the ratio between the capacitances Cgm and Cga;

$$x'2/x'3 = Cgm/Cga$$

The following is a theoretical explanation which justifes the fact that, provided the reactance elements $x'2$ and $x'3$ are appropriately chosen, the assembly of FIG. 3 enables the simultaneous setting of the input tuning and of the neutrodyning operation throughout the range of working frequencies of the amplifier. The setting is done solely by variation of the value of the third reactance element.

Figure 4:
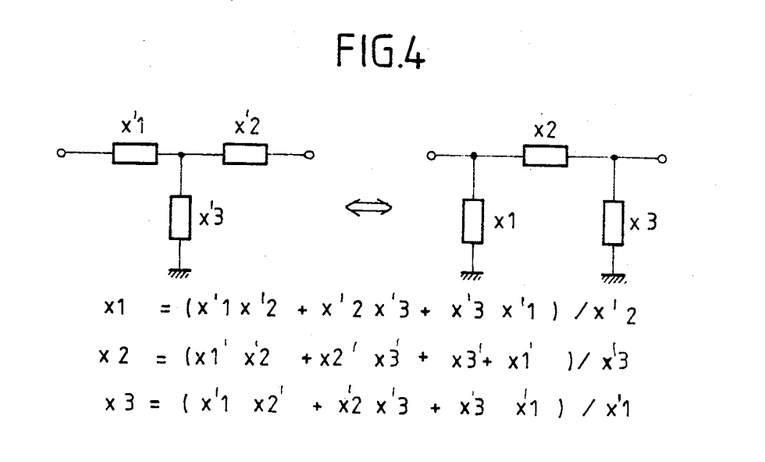
FIG. 4 explains the mathematic equivalence between a delta quadrupole configuration and a star-connection quadrupole configuration.

The star connection of the reactance elements $x'1$, $x'2$, $x'3$ is strictly equivalent, from an electrical point of view, to a delta connection of three other reactance elements, x1, x2, x3, the values of which are related to $x'1$, $x'2$, $x'3$ by the following relationships:

$$x1 = (x'1\ x'2 + x'3 + x'3\ x'1)/x'2 \quad (1)$$

$$x2 = (x'1\ x'2 + x'2\ x'3 + x'3\ x'1)/x'3 \quad (2)$$

$$x3 = (x'1\ x'2 + x'2\ x'3 + x'1)/x'1 \quad (3)$$

(see figure 4)

Figure 5:
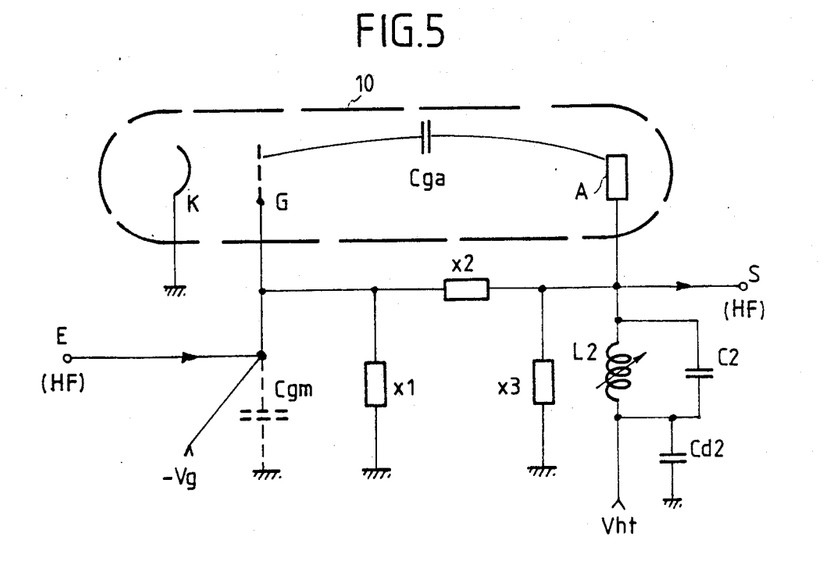
FIG. 5 shows a drawing of a neutrodyned amplifier in a delta connection of three reactance elements.

FIG. 5 shows a theoretical electrical diagram which is strictly equivalent to the diagram of FIG. 3 after a star/delta conversion. The diagram of FIG. 5 is not used in the present invention. It is given to facilitate the explanation of the choices made in the invention.

The delta connection is close to the one used until now, for example in FIG. 2: the reactance element x1 would be the inductive element $L1.Cgm.w^2=1$. which must be placed in parallel with the capacitance Cgm to achieve an input tuning by the formula $L1.Cgm.w^2=1$. The reactance element x2 would be the inductive element L3 which must be placed in parallel with the capacitance Cga to achieve the neutradyne according to the formula $L3.Cga.w^2=1$; the reactance element x3 would be considered as being infinite in the diagram of FIG. 2, the output tuning circuit L2, C2 being taken separately and being repeated in FIG. 3. However, in the assembly of FIG. 2, the inductive elements L2 and L3 should both be variable.

In the step of the present invention, it is considered firstly, that a non-infinite reactance value of x3 can be added, in parallel, to the output tuning circuit L2, C2 although a reactance of this type does not appear to be necessary in principle, and although it is then possible to convert the delta connection of the three reactance elements x1, x2, x3, into a star connection of three reactance elements x'1, x'2, x'3, to observe the result thereof.

The basic hypothesis, starting from the delta connection of FIG. 5, is that input tuning and efficient neutrondyning are achieve at the same time, regardless of the frequency, if it can be written (regardless of the frequency f (pulse w=2πf)), that the value of the reactance element x1 is a pure inductance equal to j/Cgm.w and that the value of the reactance element x2 is a pure inductance equal to j/Cga.w.

For these two conditions express the fact that the circuit x1, Cgm is an anti-resonant circuit tuned with the frequency f and that the same is true for the circuit x2, Cga. The impedances of these tuned circuits are then infinite.

If these equalities persist despite the variations in frequency F, it means hat the impedance of the anti-resonant circuit x1, Cgn will remain infinite as also the impedance of the anti-resonant circuit x2 Cga.

Consequently if, in these conditions, frequency tuning is found for both anti-resonant circuits simultaneously, x3 can take any value without altering the tuning f the input circuit nor that of the neutrodyning circuit. Regardless of the value of x3, the impedance of x3 will not be brought into parallel to x1 since it is insulated from it by the infinite impedance of the tuned circuit x2, Cga. Similarly, the impedance of x3 will not be brought into parallel with x2 because it is insulated from it by the infinite impedance of the anti-resonant circuit x1, Cgm.

If, consequently, it is possible to maintain the two above-stated equations permanently:

$$x1 = j/Cgm.w \quad (4)$$

and $$x2 = j/Cga.w \quad (5)$$

then the tuning of the input and neutrodyning circuits could be achieved in a single operation, without using trial-and-error methods to obtain the result sought by successive approximations.

The only way to reach the two above-mentioned equations simultaneously, independently of the frequency, is to keep the ratio x1/x2 constantly equal to the ratio Cga/Cgm.

$$x1/x2 = Cga/Cgm \quad (6)$$

The reactance elements x1 and x2 are made conventionally in the form of variable inductive elements, and it is not easy to make two inductive elements vary simultaneously by means of a single setting slider while keeping the same ratio.

According to the invention, after having introduced, in accordance with FIG. 5, the additional reactance element x3, which is apparently unnecessary, the delta/star conversion is done to achieve the diagram of FIG. 3 and the above equations are rewritten in keeping with the impedance conversion formulae recalled in FIG. 4. The result of this is firstly:

$$x'3/x'2 = x1/x2 = Cga/Cgm \quad (7)$$

and then $$x'1 = [(j/Cgm.w) - x'3]/[1 + (Cga/Cgm)] \quad (8)$$

The equation (7) which expresses the constancy of the ratio between two reactance values is quite similar to the equation (6). It might therefore be thought that the delta/star transposition only passes on to x'2 and x'3 the problem encountered for x1 and x2, namely the possibility of making two reactance values vary while keeping them constantly in the same ratio.

The fundamental difference from the previous case lies in the fact that it is now possible to choose reactance values of x'3 and x'2 which are constant, in the ratio Cga/Cgm, and to make x'1 vary as a function of the desired frequency f so as to maintain the equation (8). In the case of FIG. 5, it is not possible to keep x1 and x2 constant in the ratio Cga/Cgm and to make x3 vary, for the variation of x3 then has no influence on the tunings sought.

Figure 6:
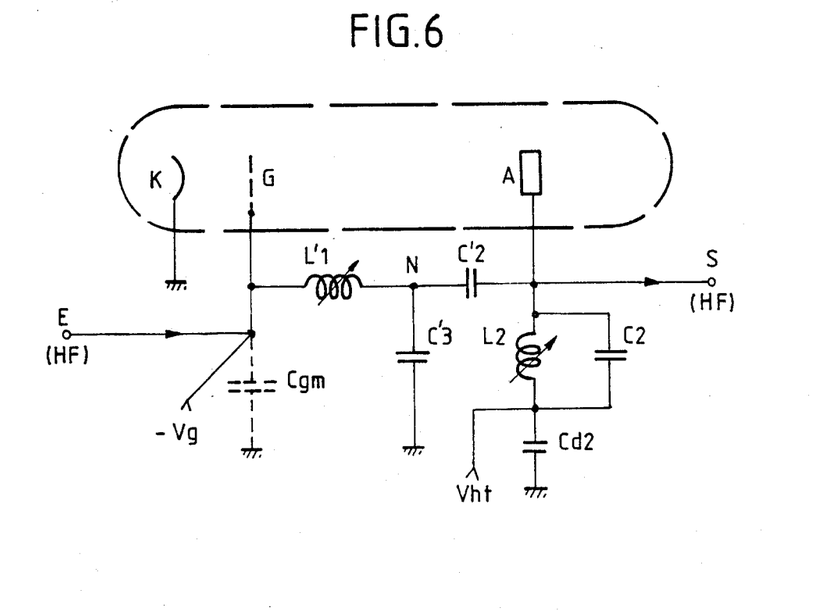
FIG. 6 shows an exemplary embodiment of the invention wherein the variable reactance element is an inductive element.

In a first embodiment, shown in FIG. 6, a capacitive reactance is chosen for x'2 and, consequently, also for x'3. A capacitive element C'2 is thus connected between the second electrode (anode A) and the common node N of the star connection. A capacitive element C'3 is connected between the third electrode (cathode K or ground M) and the common node.

The capacitances of C'2 and C'3 have the ratio:

$$C'3/C'2 = Cgm/Cga \quad (9)$$

so that their reactances are in the reverse ratio.

And depending on the formula (8), the value of the reactance element x'1 should assume the value:

$$x'1 = [(j/Cgm. w) - 1(jC'3. w)]/[1 + (Cga/Cgm)]$$

or $$x' = j [(1/Cgm. w) + (1/C'3. w)]/[1 + (Cga/Cgm)] \quad (10)$$

The reactance of x'1 should therefore be a positive reactance and it will therefore be achieved by a variable inductive element, the value of which will vary between two limits, which will be chosen as a function of the following numerical values:

the value of the stray capacitance Cga and of the capacitance Cgm;
value chosen for C'3;
limit values w0 and w1 of the range of frequencies in which it is desired to make the amplifier work When the inductance is made to vary between these limits, a direct correspondence will be found between the inductance value and the frequency value for which the frequency tuning is made. Only one setting will be necessary.

In stating that the capacitances of C'3 and C'2 are fixed, it is meant that they are not designed to be set by the user when he seeks to tune his amplifier (especially to change operating frequency). However, it will be understood that at least one of the two capacitive elements can be adjusted once and for all when the amplifier is installed (or even when the active component of the amplifier is replaced) given the uncertainties weighing on the value of the capacitances Cga and Cgm.

Figure 7:
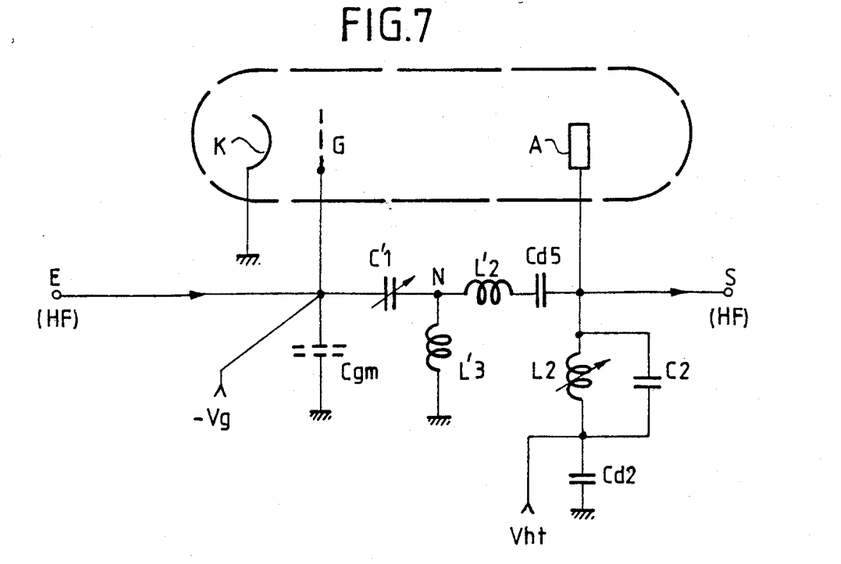
FIG. 7 shows another exemplary embodiment wherein the variable reactance element is a capacitive element.

In another embodiment, which can be seen in FIG. 7, the reactance elements x'2 and x'3 are made in the form of inductive elements L'2 and L'3 and the reactance element x'1 is made in the form of a variable capacitive element C'1.

The value of the reactance element x1 is deduced from the formula (8) with x'3 = jL'3.w.

$$x'1=[(j/Cgm.w)-jL'3.w)]/[1+(Cga/Cgm)] \quad (11)$$

The value of the inductive element L'3 is chosen, as a function of the range of frequency values desired for the amplifier, in such a way that L'3.w is always substantially greater than 1/Cgm.w in this range. Thus, x'1 has a negative reactance throughout this range and may be made in the form of a variable capacitive element C'1 as shown in FIG. 7.

But it can be seen, from the formula (11), that it is also possible to choose an inductive element L'3 such that for the entire range of frequencies desired, L'3.w is smaller than 1/Cgm.w. An assembly is ten achieved such as the one shown in FIG. 8, for these three reactance elements x'1, x'2, x'3 must now be made by three inductive elements L'1, L'2, L'3, the first one being a variable inductive element.

Finally, for x'1, it is also possible to choose an impedance with both an inductive characteristic and a capacitive characteristic, but, of course, in order not to lose the main advantage of the invention, namely the possibility of setting with a single variable element, a variable capacitive element and a variable inductive element will not be used at the same time. A line with distributed constants will be used which, for a given frequency, will have either a positive or negative reactance depending on its length. The frequency will be tuned by adjusting this length.

Figure 8:
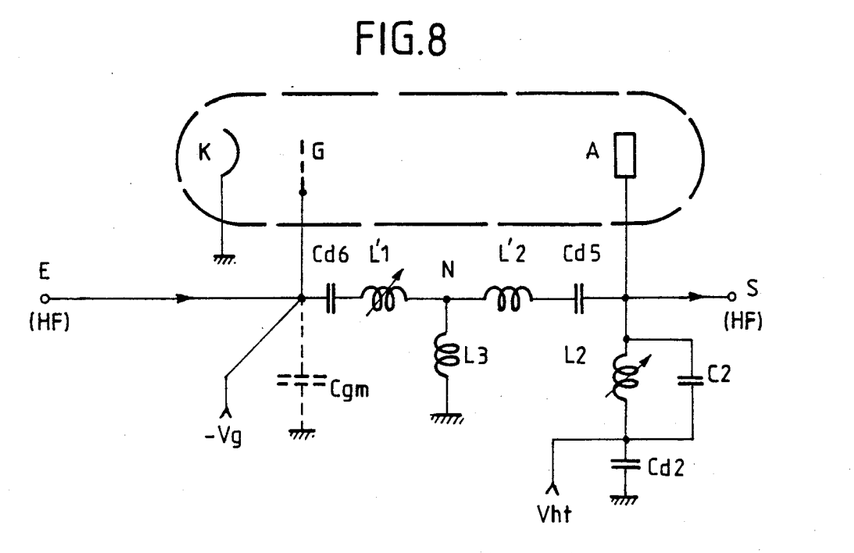
FIG. 8 shows another example with an inductive variable reactance element.

In FIGS. 7 and 8, uncoupling capacitive elements, Cd6 and Cd5 respectively, have been added in series with the inductive elements, L'1 and L'2, to prevent the transmission of DC potentials between the anode and the gate by means of the inductive elements. These uncoupling capacitive elements have a capacitance value which is sufficiently high to form null impedance short-circuits at the working frequencies considered. Their value, therefore, ddoes not come into play in the above mathematical formulae.

We shall now explain how the invention can be transposed to cases where it is sought to make a simultaneous setting of the output tuning (and no longer the input tuning) and the neutrodyning. This may be valuable, for example, in the course of amplifiers with a wide input band wherein practically only the output must be tuned to a working frequency.

The diagram of FIG. 2 (the diagram of the standard neutrodyned amplifier) is again taken as the starting point: firstly, the variable output tuning inductive element L2 is eliminated and secondly, the neutrodyning variable inductive element L3 is eliminated. Then, between the gate electrodes G, cathode electrodes K and anode electrodes A, a delta connection of three reactance elements, x1, x2, x3, is interposed as in FIG. 5: x1 between gate and cathode, x2 between gate and anode, x3 between anode and cathode.

Figure 9:
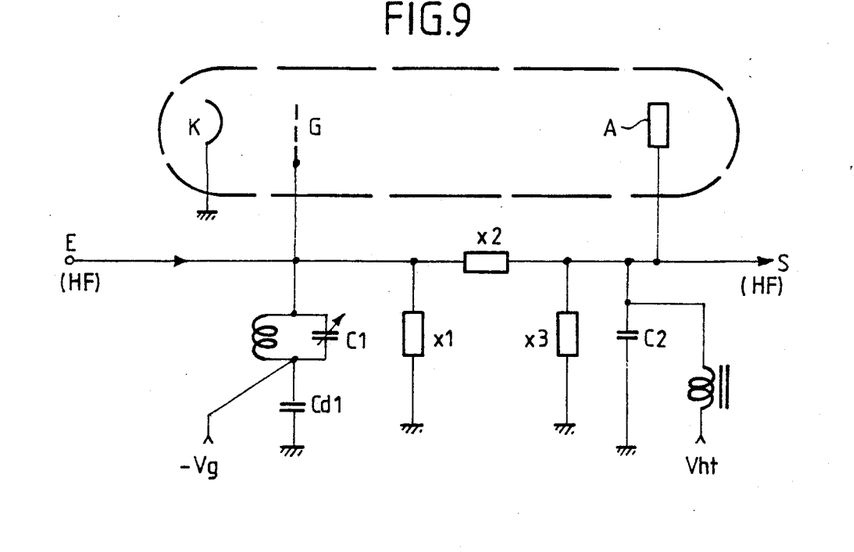
FIG. 9 shows an amplifier neutrodyned by a delta connection of three reactance elements.

This leads to the diagram of FIG. 9, which however, is not a part of the present invention.

This diagram is then converted by replacing the reactance elements, x1, x2, x3, by a star connection of three reactance elements, x'1, x'2, x'3, with the same mathematical relationships as above. These relationship are recalled in FIG. 4. This leads to the diagram of FIG. 10.

Figure 10:
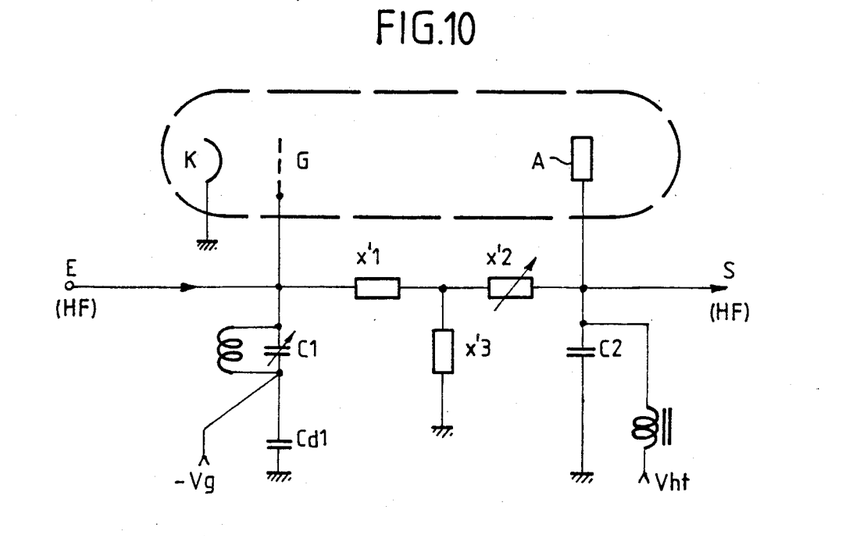
FIG. 10 shows a general drawing of a neutrodyned amplifier according to the invention in a case where it is sought to achieve the neutrodyning and the frequency tuning at the output of the operation at the output of the amplifier in a single operation.

According to the invention, the reactance elements x'1 and x'3 are made in the form of fixed reactance elements (or, if necessary, reactance elements which can be set once and for all according to the characteristics of the tube and the desired frequency range) and the reactance element x'2 is made in the form of a variable reactance element which can be set by the use according to the working frequency.

The output tuning and neutrodyning are achieved simultaneously on condition that the following are had simultaneously.

$$x3 = j/C2.w \quad (12)$$

and $$x2 = j/Cga.w \quad (13)$$

wherein C2 represents the total capacitance between the anode and the cathode. This expresses the fact that there is an anti-resonant circuit tuned in output and an anti-resonant circuit tuned between the anode and the gate. The reasoning is the same as the on applied to the simultaneous input tuning and neutrodyning.

The only way to arrive at these two equations simultaneously, despite the frequency variations, is to keep the ratio x3/x2 constantly equal to Cga/C2.

By making the delta/star conversion of the reactance of x1, x2, x3, these two equations are re-written s follows:

$$x'3/x' = Cga/C2 \quad (14)$$

$$'2 = [(j/C 2. w - x'3]/[1+(Cga/C2)] \quad (15)$$

It is quite possible to choose the reactances x'1 and x'3 as being constant and to adjust the tuning by acting solely on the value of the reactance element x'2.

As for the input tuning, several embodiments are possible, among which:

(a) x' and x'3 are capacitive elements, and x'2 is then a variable inductive element.

(b) x'1 and x'3 are inductive elements (in series, here necessary, with uncoupling capacitive elements of almost null reactance) and x'2 is then either a variable inductive element or a variable capacitive element depending on the sign of (1/C2.w)−x'3 in the frequency range considered. The reactance elements x'1, x'2 and x'3 may naturally also be lines with distributed constants.

Without entering into the details of all the possible embodiments of amplifiers, it will be understood that the invention can be applied whenever a neutrodyning and an input or output tuning problem has to be resolved.

For example, the invention can be used in the case of a triode assembly with gate at the ground, the input signal being applied to the cathode and tee output signal being given by the anode.

In this case, the reactance element x'1, which is variable if the neutrodyning is done simultaneously with the input tuning, is connected between the common node of the star connection and the cathode. The reactance element x'2, which is variable if it is sought to do the neutrodyning at the same time as the output tuning, is connected between the common node and the gate, and the fixed reactance element x'3 is connected between the common node and the gate. The computation of the reactances then brings out the fact that the ratio of reactances x'2/x'3 (the example of neutrodyning with input tuning) is preferably equal to Cka where Ckm is the total capacitance (stray capacitance and external capacitances if any) existing between cathode and gate, and Cka is the total capacitance (in principle a stray capacitance) between anode and cathode. The term Cgm/Cga of the equations (9) and (10) should therefore be replaced by Ckm/Cka. In the case of neutrodyning done with output tuning, the capacitance Cga should be replaced by the capacitance Cka in the equations 14 and 15 to obtain the equations defining the relative values of the three reactance elements in star connection.

Other assemblies again are possible, for example with tetrodes or pentodes and, in this case, the three reactance elements are mounted between the electrode receiving the input signal to be amplified, the electrode giving the output signal and the electrode defining the reference potential (ground) for these two signals. The other electrodes modify, if necessary, the distribution of the stray capacitances, but do not modify the principle of the invention.

What is claimed is:

1. A high-frequency amplifier, provided with at least one active component said active component comprising at least three electrodes, wherein, in order to facilitate the tuning with the working frequency and the neutrodyning of the amplifier, there is provided a star connection of three reactance elements between a common node and each of the electrodes, one of the reactance elements connected to a first input electrode of signals to be amplified being variable to perform the frequency tuning and the neutrodyning, and the other two reactance elements connected to the other two electrodes being fixed and essentially having a constant ratio between them which is independent of the frequency in the range of frequencies in which it is desired to make the amplifier work.

2. An amplifier according to claim 1, wherein the ratio between the value of the reactance element connected to a second electrode and the value of the reactance element connected to a third electrode is essentially equal to the ratio between, firstly, the capacitance existing between the first electrode and the third electrode and, secondly, the capacitance existing between the first electrode and the second electrode.

3. An amplifier according to either of the claims 1 or 2, wherein the variable reactance element is a variable inductive element enabling frequency setting by the user and wherein the other two reactance elements are essentially fixed capacitive elements which can be set, if necessary, once and for all as a function of the characteristics of the active component and the desired working frequency range.

4. An amplifier according to either of the claims 1 or 2, wherein the variable reactance element is a variable inductive element enabling the frequency setting by the user and wherein the other two reactance elements are essentially fixed inductive elements which can be set, if necessary, once and for all as a function of the characteristics of the active component and the range of working frequencies desired.

5. An amplifier according to any of the claims 1 or 2, wherein the variable reactance element is a variable capacitive element enabling the setting of frequency by the user and wherein the other two reactance elements are essentially fixed inductive elements which can be set, if necessary, once and for all, as a function of the characteristics of the active component and the frequency range desired.

6. An amplifier according to claim 1, wherein the active component is a grid tube having at least one gate, one anode and one cathode constituting the three electrodes mentioned.

7. A high frequency amplifier provided with at least one active component, said active component comprisig at least three electrodes wherein, in order to facilitate the tuning with the working frequency and the neutrodyning of the amplifier, there is provided a star connection of three reactance elements between a common node and each of the electrodes, one of the reactance elements connected to a first electrode being variable to perform the frequency tuning and the neutrodyning and the other two reactance elements connected to the other two electrodes being fixed and having between them an essentially constant ratio independent of the frequency in the frequency range at which it is sought to make the amplifier work, the ratio between the reactance element connected to a second electrode and the reactance element connected to a third electrode being essentially equal to the ratio between, firstly, the capacitance existing between the first electrode and the third electrode, and, secondly, the capacitance existing between the first electrode and the second electrode.

8. An amplifier according to claim 7 wherein the variable reactance element is a variable inductive element enabling the frequency setting by the user and wherein the other two reactance elements are essentially fixed capacitive elements which can be set, if necessary, once and for all, depending on the characteristics of the active component and the desired range of acting frequencies.

9. An amplifier according to claim 7, wherein the variable reactance element is a variable inductive element enabling the setting of frequency by the user, and wherein the other two reactance elements are essentially fixed inductive elements which can be set, if necessary, once and for all as a function of the characteristics of the active component and the desired range of working frequencies.

10. An amplifier according to claim 7, wherein the variable reactance element is a variable capacitive element enabling the setting of frequency by the user and wherein the other two reactance elements are essentially fixed inductive elements which can be set, if necessary, once and for all as a function of the characteristics of the active component and the desired range of frequencies.

11. An amplifier according to any of the claims 7 to 10, wherein the first electrode is a signal input electrode for the amplifier, the second and third electrodes being, respectively, a signal output electrode and a potential reference electrode for the high frequency signals.

12. An amplifier according to any of the claims 7 to 9, wherein the first electrode is a signal output electrode for the amplifier, the second and third electrodes being, respectively, a signal input electrode and a reference potential electrode for the high frequency signals.

* * * * *